(12) United States Patent
Benton et al.

(10) Patent No.: US 7,262,603 B1
(45) Date of Patent: Aug. 28, 2007

(54) SYSTEM AND METHOD FOR SENSING THE FORMATION OF TIN WHISKERS

(75) Inventors: Farrel David Benton, Raleigh, NC (US); Shane Christopher Branch, Raleigh, NC (US); Robert J. Kapinos, Durham, NC (US); Alberto Jose Rojas, Morrisville, NC (US); James Stephen Rutledge, Durham, NC (US); James C. Salembier, Cary, NC (US); Simon David Nicholas Taylor, Cary, NC (US); Sean Michael Ulrich, Morrisville, NC (US)

(73) Assignee: Lenovo (Singapore) Pte. Ltd, Singapore (SG)

( * ) Notice: Subject to any disclaimer, the term of this patent is extended or adjusted under 35 U.S.C. 154(b) by 0 days.

(21) Appl. No.: 11/427,067

(22) Filed: Jun. 28, 2006

(51) Int. Cl.
G01R 31/08 (2006.01)

(52) U.S. Cl. ............... 324/515; 324/528; 324/531; 324/525; 324/512

(58) Field of Classification Search ............ 324/528, 324/531, 525, 512, 515
See application file for complete search history.

(56) References Cited

U.S. PATENT DOCUMENTS 6,859,024 B2 * 2/2005 Molnar et al. ............ 324/71.4

2006/0027933 A1 * 2/2006 Chen et al. ............... 257/772

FOREIGN PATENT DOCUMENTS

| JP | 04314345 A | * | 11/1992 |
| JP | 2001074801 A | * | 3/2001 |
| JP | 2001228107 A | * | 8/2001 |

* cited by examiner

Primary Examiner—Anjan Deb
Assistant Examiner—Thomas Valone
(74) Attorney, Agent, or Firm—Van Leeuwen & Van Leeuwen; Carlos Munoz-Bustamante

(57) ABSTRACT

A system and method for sensing the formation of tin whiskers is presented. An assembly substrate includes whisker detectors at various locations for detecting tin whiskers in an X direction, a Y direction, and a Z direction relative to the assembly substrate. Each whisker detector includes sense traces and a trace bridge that produce "planar gaps" and "orthogonal gaps" that are smaller than trace gaps produced by other traces on the assembly substrate. As such, tin whiskers short across the planar gaps and orthogonal gaps before they short across trace gaps. When the assembly substrate is finished with processing steps, a system tester performs a continuity test on the whisker detectors. When the continuity test fails, an operator is notified to check for tin whiskers on the assembly substrate. Once shipped, a processor monitors the whisker detectors for shorts throughout the product's lifecycle.

20 Claims, 8 Drawing Sheets

SYSTEM AND METHOD FOR SENSING THE FORMATION OF TIN WHISKERS

BACKGROUND OF THE INVENTION

1. Technical Field

The present invention relates in general to a system and method for sensing the formation of tin whiskers. More particularly, the present invention relates to a system and method for using whisker detectors, which are integrated onto an assembly substrate, to detect tin whisker formations in an X direction, a Y direction, and a Z direction relative to the assembly substrate.

2. Description of the Related Art

New Restrictions of Hazardous Substances (RoHS) requirements are being established that eliminate the use of lead as a soldering material in electronic manufacturing processes. As such, manufacturers are developing processes to use tin as a soldering material. Tin, however, is prone to developing "whiskers," which are electrically conductive, crystalline structures of tin that may cause shorts between trace lines and/or solder pads that results in erratic component failures.

A challenge found is that the formation of tin whiskers is not predictable. Some theories suggest that tin whiskers form from stress-induced manufacturing processes. Failures caused by tin whiskers, however, may not arise until later in a product's lifecycle. For example, tin whisker formations may not cause failures until years after being in the field. Once a failure occurs, a product may be shipped back to a manufacturing facility, where the tin whiskers are located using visual inspection.

What is needed, therefore, is a system and method that detects tin whiskers throughout a product's lifecycle prior to the tin whiskers causing component failures.

SUMMARY

It has been discovered that the aforementioned challenges are resolved using a system and method for using whisker detectors, which are integrated onto an assembly substrate, to detect tin whisker formations in an X direction, a Y direction, and a Z direction relative to the assembly substrate. A product's assembly substrate includes whisker detectors at various locations for detecting tin whiskers. Each whisker detector includes sense traces and a trace bridge that result in a "sense gap," which includes a "planar gap" and an "orthogonal gap." As tin whiskers form, they short across the planar gaps and orthogonal gaps before they short across other trace gaps due to their widths. A system tester may perform a continuity test using the whisker detectors prior to product shipment. Once shipped, a processor monitors the whisker detectors for shorts throughout the product's lifecycle.

An assembly substrate's whisker detector includes sense traces and a trace bridge. The sense traces are incorporated onto the assembly substrate's surface layout and, therefore, proceed through the same manufacturing steps as the assembly substrate. The distance between the two sense traces is called a "planar gap," which is smaller than the gap between other adjacent traces (trace gaps) on the assembly substrate.

Once the assembly substrate proceeds through soldering steps, a trace bridge is installed on top of one of the sense traces, which creates an orthogonal gap between the trace bridge and the other sense trace. The orthogonal gap is similar to the planar gap in that the width of the orthogonal gap is less than the gap between trace gaps on the assembly substrate. As a result, as tin whiskers form, they short across the planar gaps and orthogonal gaps sooner than they would short the other traces (trace gaps) on the assembly substrate.

When the assembly substrate is finished with processing steps, a system tester performs a continuity test on the whisker detectors. When the continuity test fails, an operator is notified to check for tin whiskers on the assembly substrate. In one embodiment, an assembly substrate may include whisker detectors that are spaced apart from each other in order to detect tin whisker formations at various assembly substrate sections. For example, an assembly substrate may include whisker detectors three inches apart from each other so that when a continuity failure occurs, an operator is able to pinpoint the location on the assembly substrate and check for tin whiskers. Once shipped, a processor monitors the whisker detectors for shorts throughout the product's lifecycle.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

The following is intended to provide a detailed description of an example of the invention and should not be taken to be limiting of the invention itself. Rather, any number of variations may fall within the scope of the invention, which is defined in the claims following the description.

Figure 1:
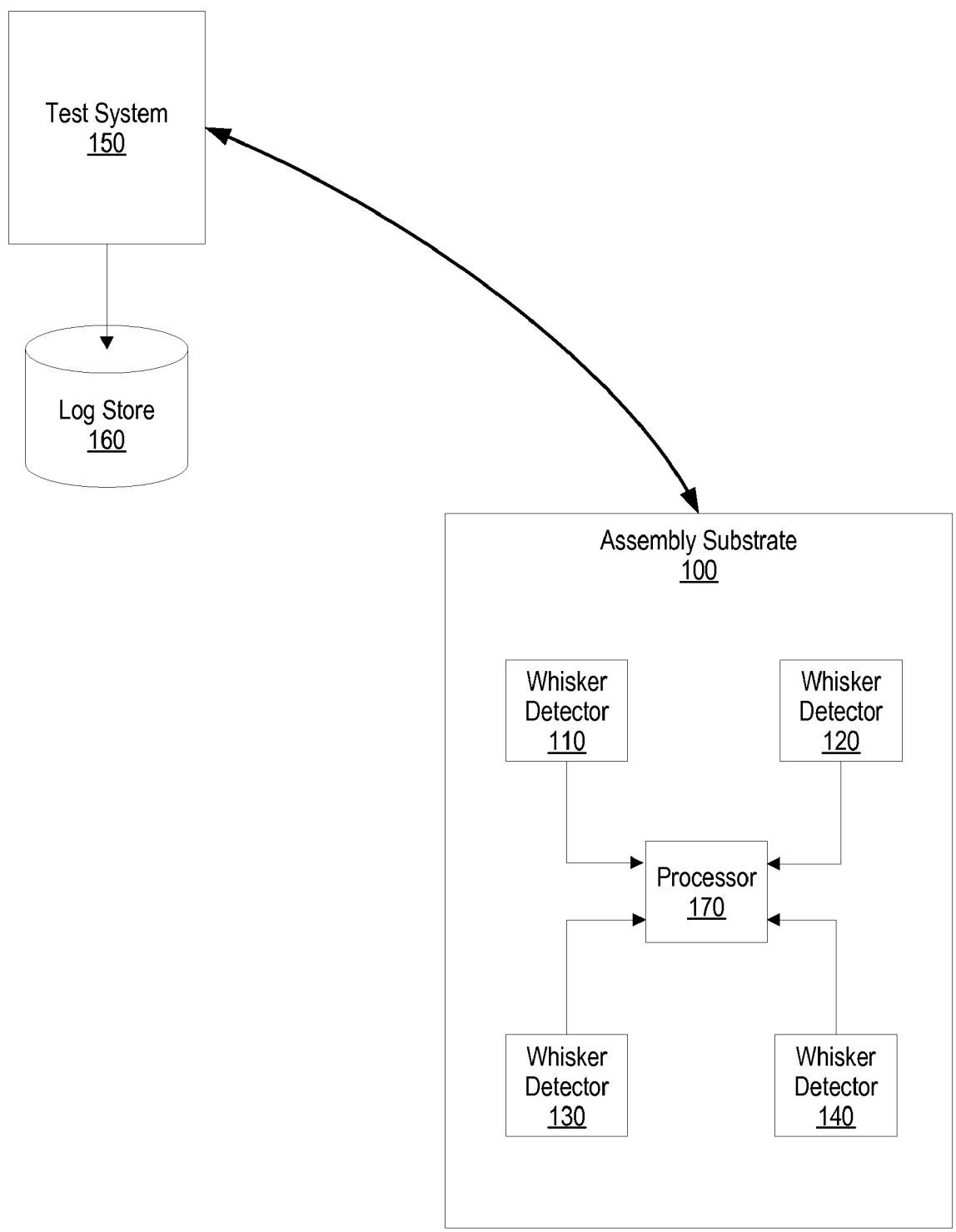
FIG. 1 is a diagram showing a test system using whisker detectors, which are integrated onto an assembly substrate, to test for the presence of tin whiskers.

FIG. 1 is a diagram showing a test system using whisker detectors, which are integrated onto an assembly substrate, to test for the presence of tin whiskers. A soldering process uses tin to solder components (integrated circuits, memory, etc.) onto assembly substrate 100. Tin is prone to developing "whiskers," which may cause shorts on the assembly substrate. As such, assembly substrate 100 includes whisker detectors 110-140 that detect tin whisker formations in a "sense gap," which includes a "planar gap" and an "orthogonal gap." The planar gap detects tin whisker formations along the plane of a corresponding assembly substrate, and the orthogonal gap detects tin whisker formations in a direction orthogonal to the plane of the assembly substrate.

Each of whisker detectors 110-140 includes two sense traces, which are created while generating assembly substrate 100. As a result, the sense traces are integrated onto assembly substrate 100 and proceed through the same process steps as assembly substrate 100. The distance between the two sense traces, called a "planar gap," is less than the distance between other gaps (trace gaps) between adjacent traces included on assembly substrate 100. As such, tin whiskers are detected more easily using whisker detectors 110-140 due to the smaller planar gap. In addition, each of whisker detectors 110-140 includes a trace bridge that, in conjunction with the sense traces, detects tin whiskers that protrude in the Z direction relative to assembly substrate 100 (see FIGS. 3A, 3B, and corresponding text for further details).

Once processing populates assembly substrate 100 with components, performs soldering steps, and installs the trace bridges, assembly substrate 100 is ready for test. Test system 150 performs continuity tests on whisker detectors 110-140 using an apparatus, such as a bed of nails socket, and logs failures in log store 160. For example, tin whiskers may form on whisker detector 130. In this example, the tin whiskers short the sense traces (and/or trace bridge) to each other, resulting in a failed continuity test.

Figure 2:
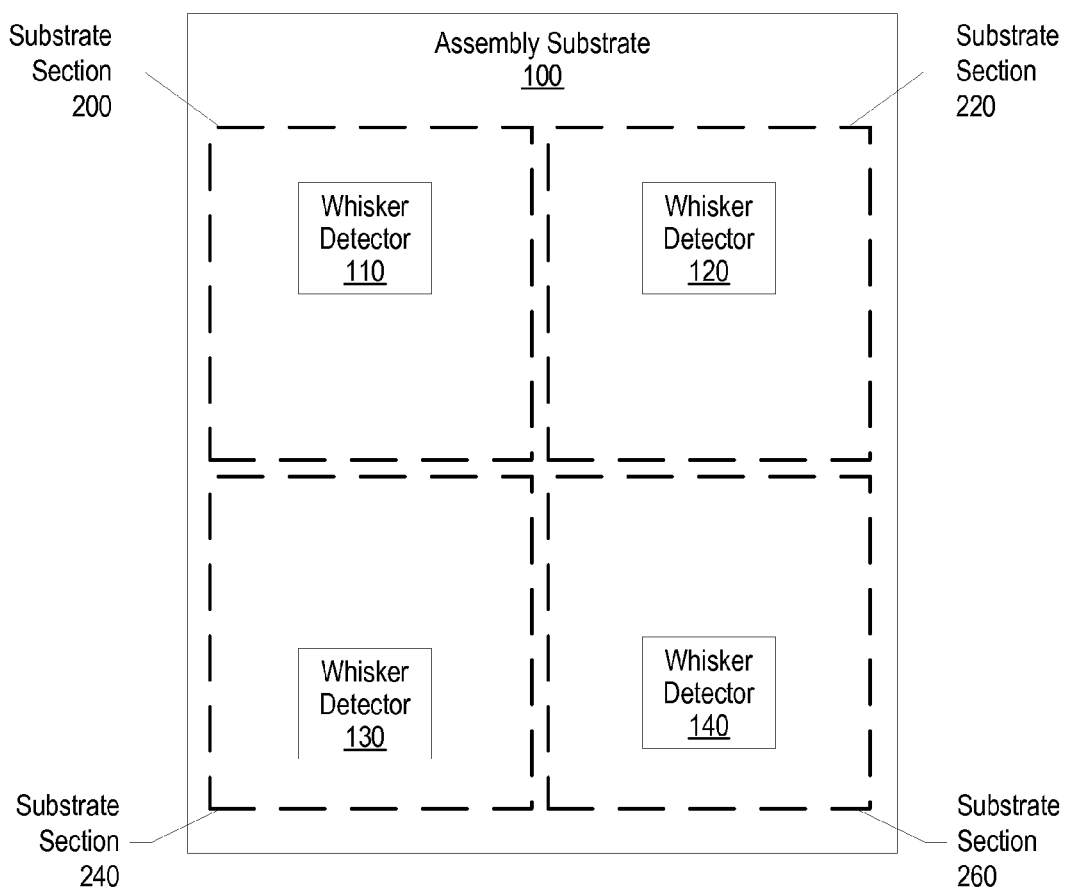
FIG. 2 is a diagram showing a plurality of whisker detectors in which each whisker detector corresponds to a substrate section of an assembly substrate.

Test system 150 may also log which whisker detector failed a continuity test in order to assist an operator in locating which section of assembly substrate 100 to analyze (see FIG. 2 and corresponding text for further details). Log store 160 may be stored on a nonvolatile storage area, such as a computer hard drive. Once test system 150 tests each of whisker detectors 110-140, test system 150 notifies an operator if a failure occurred during the continuity test. Once assembly substrate 100 ships and is in operation at a user's facility, processor 170 monitors whisker detectors 110-140 throughout assembly substrate 110's lifecycle (see FIG. 4, 7, and corresponding text for further details).

FIG. 2 is a diagram showing a plurality of whisker detectors in which each whisker detector corresponds to a substrate section of an assembly substrate. An assembly substrate developer may include whisker detectors at various positions of assembly substrate 100 in order to detect tin whisker formations at various assembly substrate sections. For example, an assembly substrate designer may include whisker detectors three inches apart from each other so that when a continuity failure occurs, an operator is able to pinpoint the location on assembly substrate 100 and check for tin whiskers. Assembly substrate 100 is the same as that shown in FIG. 1.

Assembly substrate 100 includes whisker detectors 110-140, which are the same as that shown in FIG. 1. Whisker detectors 110-140 correspond to substrate sections 200-260, respectively. As such, when one of whisker detectors 110-140 fails a continuity test, an operator is able to analyze a particular substrate section instead of analyzing the entire assembly substrate 100. For example, whisker detectors 110-130 may pass a continuity test, but whisker detector 140 fails the continuity test. In this example, an operator focuses on analyzing substrate section 260 for tin whiskers.

Figure 3A:
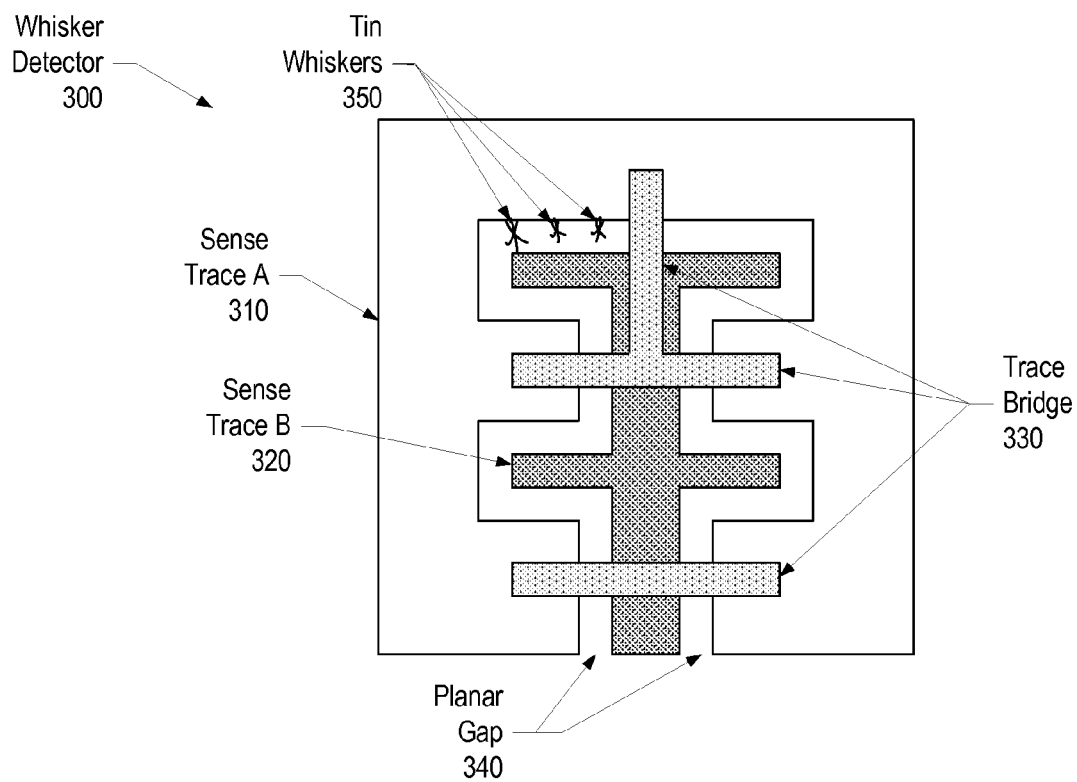
FIG. 3A is a diagram showing a top view of a whisker detector.

FIG. 3A is a diagram showing a top view of a whisker detector. Whisker detector 300 includes sense trace A 310, sense trace B 320, and trace bridge 330. Sense trace A 310 and sense trace B 320 are integrated onto an assembly substrate and are created at the time that other traces are created on the assembly substrate. Once components are placed on the assembly substrate and proceed through a soldering process, trace bridge 330 is attached to sense trace A 310 (see FIGS. 3A, 5, and corresponding text for further details).

Planar gap 340 is a gap that exists between sense trace A 310 and sense trace B 320. The width of planar gap 340 is less than the gap between other traces (trace gaps) on the assembly substrate. As a result, as tin whiskers 350 form, they short sense trace A 310 to sense trace B 320 sooner than they would short the other traces on the assembly substrate.

Figure 3B:
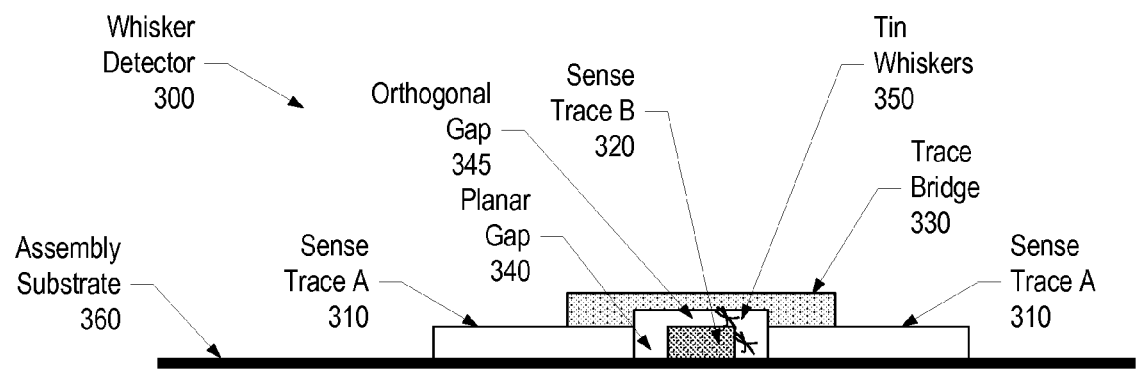
FIG. 3B is a diagram showing a side view of a whisker detector.

Sense trace A 310 and sense trace B 320 detect tin whiskers that form in the X direction and Y direction relative to the assembly substrate, and trace bridge 330 detects tin whiskers that form in the Z direction relative to the assembly substrate (see FIG. 3B and corresponding text for further details). As is evident from FIGS. 3A and 3B, the X and Y directions are directions generally along the plane of the assembly substrate, and the Z direction is a direction which is generally orthogonal to the plane of the assembly substrate.

FIG. 3B is a diagram showing a side view of a whisker detector. As discussed in FIG. 3A, whisker detector 300 includes sense trace A 310, sense trace B 320, and trace bridge 330, whereby sense trace A 310 and sense trace B 320 are integrated onto an assembly substrate (assembly substrate 360).

Trace bride 330 is installed onto sense trace A 310 after assembly substrate 360 proceeds through soldering steps. Installing trace bridge 330 generates a gap between trace bridge 330 and sense trace B 320, which is orthogonal gap 345. Orthogonal gap 345 is similar to planar gap 340 in that the width of orthogonal gap 345 is less than the gap between trace gaps on assembly substrate 360. As such, as tin whiskers 350 form in the Z direction, they short sense trace B 320 to trace bridge 330 (which is connected to sense trace A 310) sooner than they would short the other traces on the assembly substrate.

Figure 4:
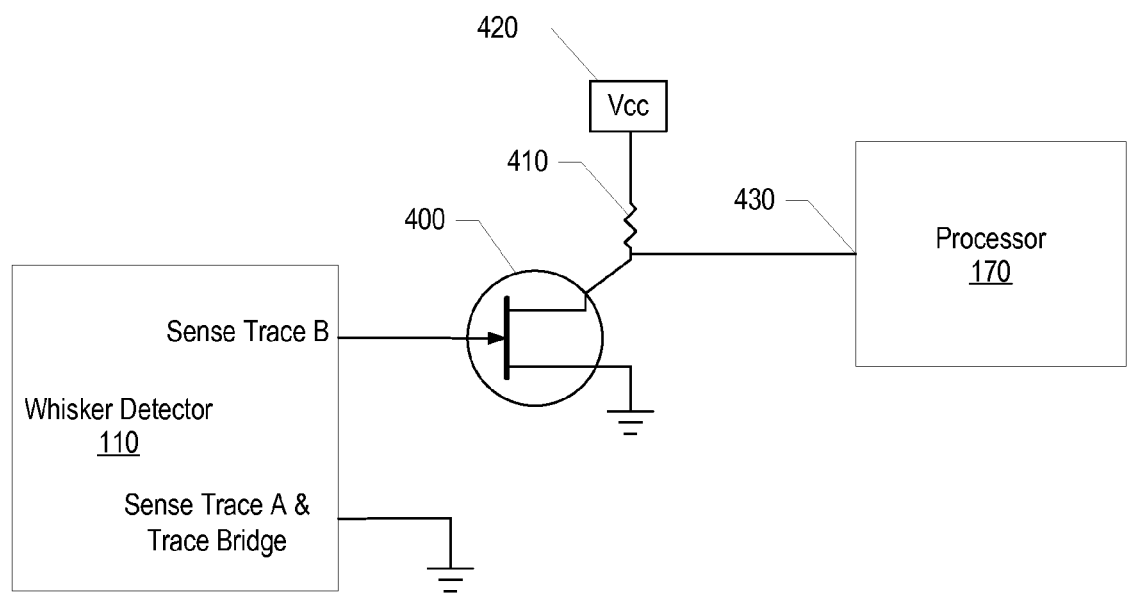
FIG. 4 is a diagram showing a processor monitoring a whisker detector's continuity using a field effect transistor.

FIG. 4 is a diagram showing an embodiment of a processor monitoring a whisker detector's continuity using a field effect transistor (FET). Tin whiskers are typically small and thin when they begin to form. As such, in order to test for continuity, a high-impedance configuration, such as with FET 400, may be used to test whisker detector 110's continuity without blowing the newly formed tin whiskers. As one skilled in the art can appreciate, other approaches may be used to monitor whisker detector continuity. Whisker detector 110 is the same as that shown in FIG. 1.

During operation, processor 170 monitors whisker detector 110 for the formation of tin whiskers. Between processor 170 and whisker detector 110 is FET 400, which is connected to Vcc 420 through resistor 410. Whisker detector 110's planar gap A (and trace bridge) are connected to ground. As tin whiskers form within whisker detector 110, whisker detector 110's planar gap B shorts to planar gap A and/or trace bridge (see FIGS. 3A, 3B, and corresponding text for further details). When this occurs, the base of FET 400 shorts to ground through whisker detector 110, thus turning on FET 400 and creating a whisker detection interrupt to processor 170 at pin 430. Processor 170 is the same as that shown in FIG. 1.

Figure 5:
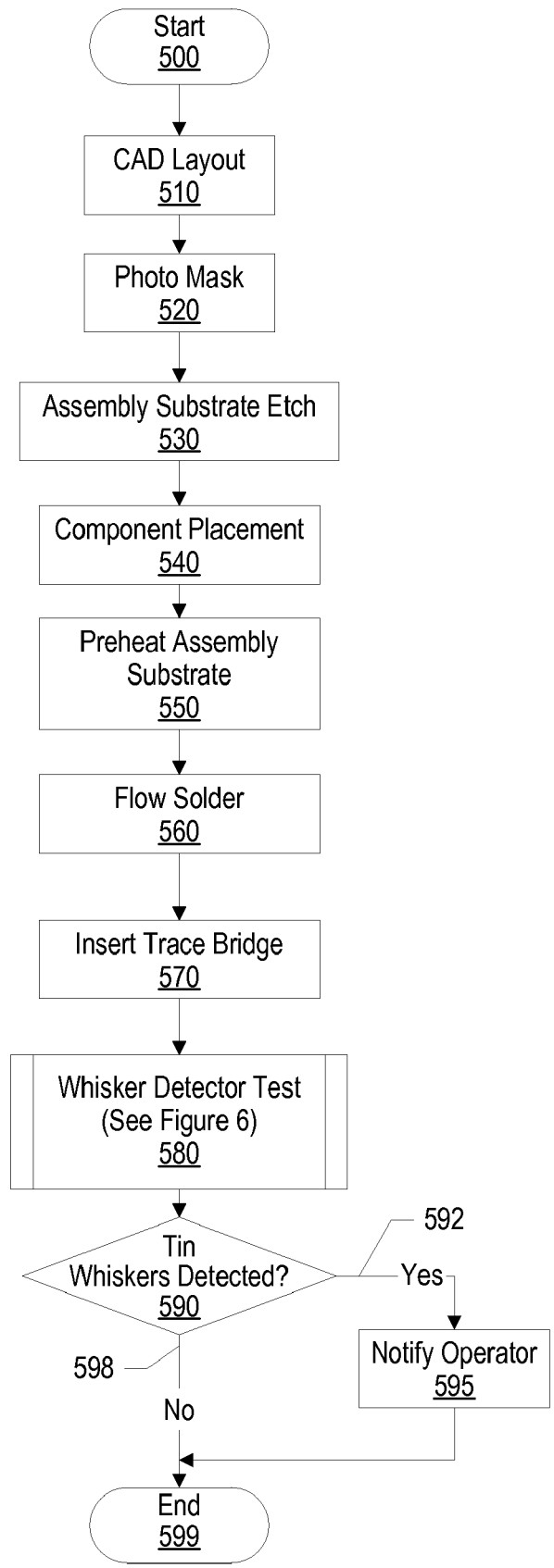
FIG. 5 is a high-level flowchart showing steps taken in creating a whisker detector and testing for tin whiskers using the whisker detector.

FIG. 5 is a high-level flowchart showing steps taken in creating a whisker detector and testing for tin whiskers using the whisker detector. Whisker detector processing commences at 500, whereupon processing performs a computer automated design (CAD) layout of an assembly substrate, which includes sense traces for one or more whisker detectors (step 510). The sense traces are located at a surface layer of the assembly substrate, and form a "planar gap" between the sense traces that is smaller than other "trace gaps" that are on the assembly substrate, which are the distances between other trace lines on the assembly substrate (see FIGS. 3A, 3B, and corresponding text for further details).

At step 520, processing creates a photo mask of the assembly substrate, which includes the whisker detector's sense traces, based upon the CAD layout that was generated in step 510. Using the photo mask, processing creates the assembly substrate, such as a printed circuit board or electronic assembly, at step 530. Again, the assembly substrate includes the whisker detector's sense traces.

Once processing creates the assembly substrate, processing places components (e.g., integrated circuits, capacitors, memory, etc.) onto the assembly substrate at step 540. At step 550, processing preheats the assembly substrate in preparation for solder. Since the whisker detector's sense traces are integrated onto the assembly substrate, the sense traces proceed through the preheat process as well. After preheat, the assembly substrate proceeds through a solder flow process at step 560 to solder the components to the assembly substrate.

Once the components have been soldered to the assembly substrate, processing inserts a trace bridge onto one of the whisker detector's sense traces at step 570. The trace bridge is one or more pieces of conductive material that is used to detect tin whiskers protruding perpendicular to the assembly substrate, such as trace bridge 330 shown in FIGS. 3A and 3B. An "orthogonal gap" is formed between the trace bridge and the other sense trace when the trace bridge is inserted onto the sense trace. Similar to the planar gap, the orthogonal gap is smaller than other trace gaps that are included on the assembly substrate.

Figure 6:
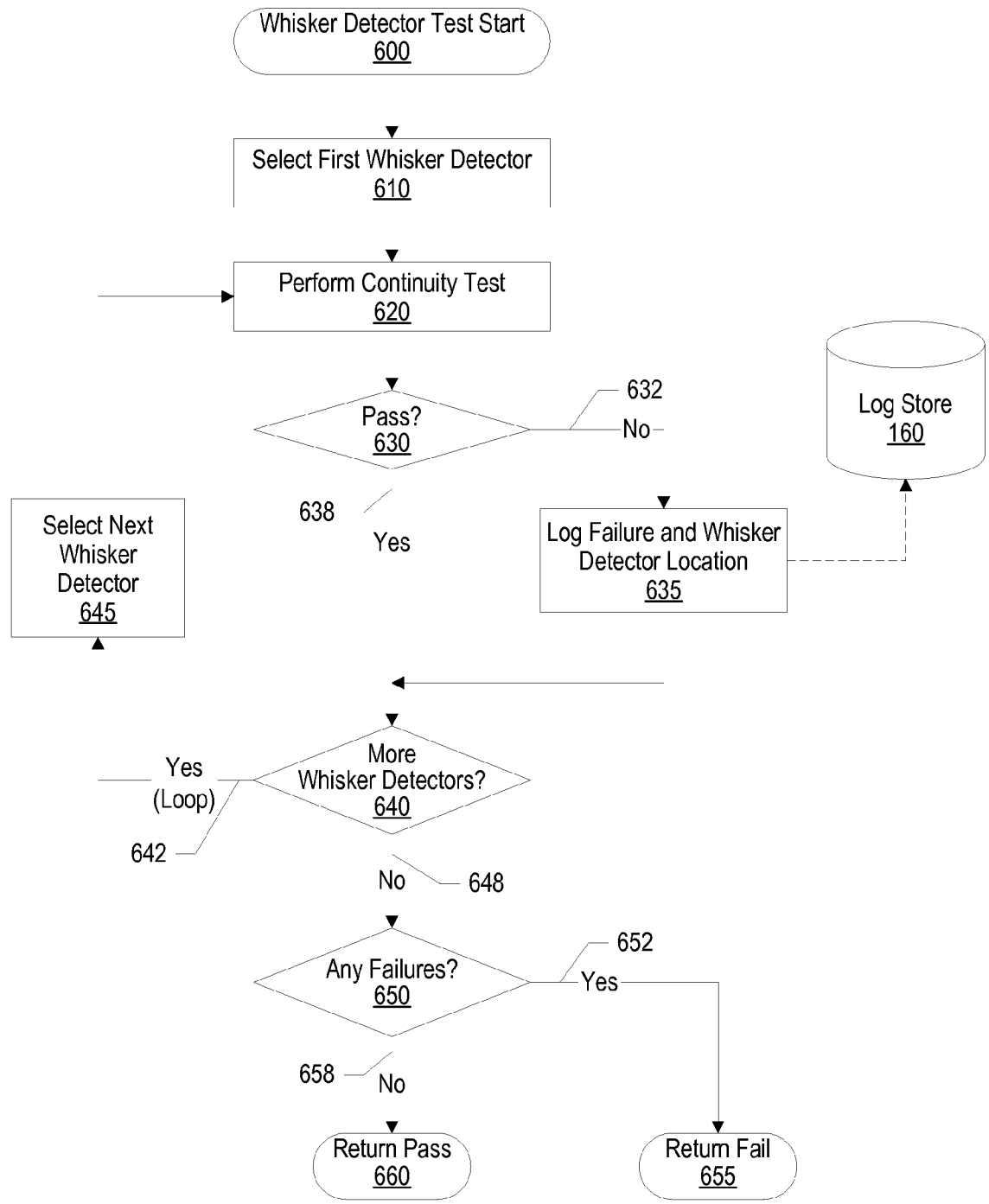
FIG. 6 is a flowchart showing steps taken in using a whisker detector to test for tin whisker formation.

Once the trace bridge is installed on the sense trace, processing tests for tin whiskers that have formed on one or more whisker detectors located at various parts of the assembly substrate (pre-defined process block 580, see FIG. 6 and corresponding text for further details).

A determination is made as to whether tin whiskers were detected on the assembly substrate (decision 590). If tin whiskers were detected, decision 590 branches to "Yes" branch 592 whereupon processing notifies an operator at step 595. When the assembly substrate includes multiple whisker detectors, the notification may include the particular whisker detector that detected the tin whiskers in order for the operator to analyze a particular assembly substrate section (see FIG. 2 and corresponding text for further details). On the other hand, if processing did not detect tin whiskers on the assembly substrate, decision 590 branches to "No" branch 598 bypassing operator notification steps. Processing ends at 599.

FIG. 6 is a flowchart showing steps taken in using a whisker detector to test for tin whisker formation. In one embodiment, an assembly substrate may include multiple whisker detectors in order to pinpoint particular substrate sections in which tin whiskers form (see FIG. 2 and corresponding text for further details).

Processing commences at 600, whereupon processing selects a first whisker detector at step 610. At step 620, processing performs a continuity test on the selected whisker detector, such as by using a bed of nails test socket. When tin whiskers form on the whisker detector, the whisker detector will fail the continuity test because the tin whiskers create a short between two sense traces and/or a trace bridge (see FIGS. 3A, 3B and corresponding text for further details).

A determination is made as to whether the whisker detector passed the continuity test (decision 630). If the whisker detector did not pass the continuity test, decision 630 branches to "No" branch 632 whereupon processing logs the continuity test failure in log store 160 (step 635). Log store 160 is the same as that shown in FIG. 1.

In embodiments where the assembly substrate includes multiple whisker detectors, the log may include which whisker detector failed the continuity test in order to inform the operator as to which section of the assembly substrate to check for tin whiskers. On the other hand, if the whisker detector passed the continuity test, decision 630 branches to "Yes" branch 638 bypassing log failure steps.

A determination is made as to whether the assembly substrate includes more whisker detectors to test (decision 640). If there are more whisker detectors to test, decision 640 branches to "Yes" branch 642, which loops back to select (step 645) and test the next whisker detector. This looping continues until there are no more whisker detectors to test, at which point decision 640 branches to "No" branch 648.

A determination is made as to whether failures occurred while performing continuity tests on the whisker detectors (decision 650). If one or more failures occurred, decision 650 branches to "Yes" branch 652 whereupon processing returns a failure at 655. On the other hand, if no failures occurred during the continuity tests, decision 650 branches to "No" branch 658 whereupon processing returns a pass at 660.

Figure 7:
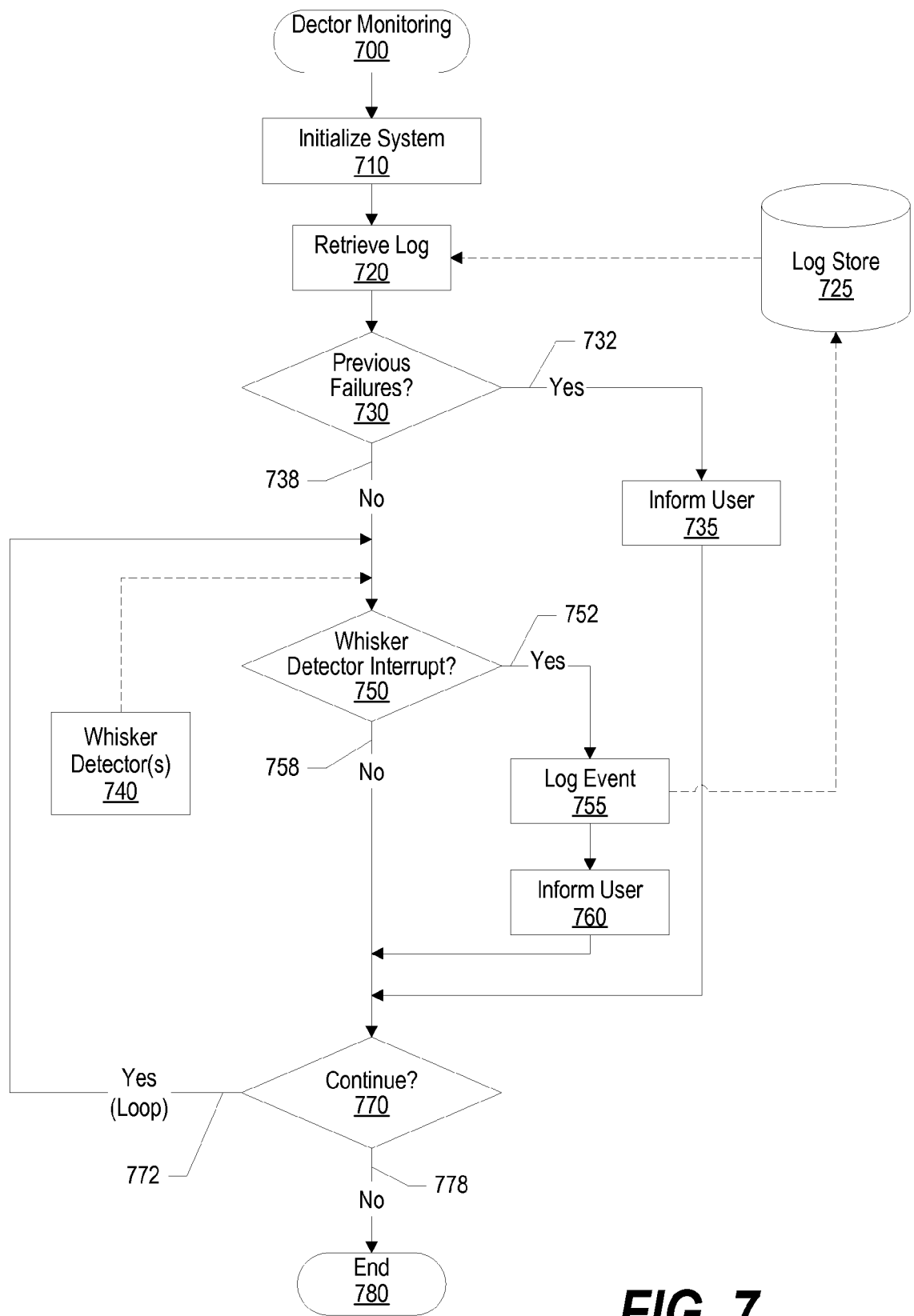
FIG. 7 is a flowchart showing steps taken in monitoring a whisker detector's continuity during operation.

FIG. 7 is a flowchart showing steps taken in monitoring a whisker detector's continuity during operation. Processing commences at 700, whereupon processing initializes at step 710. At step 720, processing retrieves a continuity test log from log store 725 that logs previous continuity failures received from one or more whisker detectors. Log store may be stored on a nonvolatile storage area, such as a computer hard drive.

A determination is made as to whether previous continuity failures occurred (decision 730). If previous continuity failures occurred, decision 730 branches to "Yes" branch 732 whereupon processing informs a user at step 735. For example, the warning may state "EARLY WARNING CONTINUITY FAILURE, PLEASE CONTACT MANUFACTURER."

On the other hand, if there are no previous continuity failures, decision 730 branches to "No" branch 738 whereupon processing monitors whisker detector(s) 740 and a determination is made as to whether one or more of whisker detector(s) 740 failed a continuity test (decision 750). If one or more of whisker detector(s) 740 failed a continuity test, decision 750 branches to "Yes" branch 752 whereupon processing logs the failure in log store 725 at step 755, and informs the user at step 760. On the other hand, if none of whisker detector(s) failed the continuity test, decision 750 branches to "No" branch 758 bypassing failure reporting steps.

A determination is made as to whether to continue monitoring whisker detector(s) 740 (decision 770). If processing should continue, decision 770 branches to "Yes" branch 772 which loops back and continues to monitor whisker detector (s) 740. This looping continues until processing should stop monitoring whisker detector(s) 740, at which point decision 770 branches to "No" branch 778 whereupon processing ends at 780.

Figure 8:
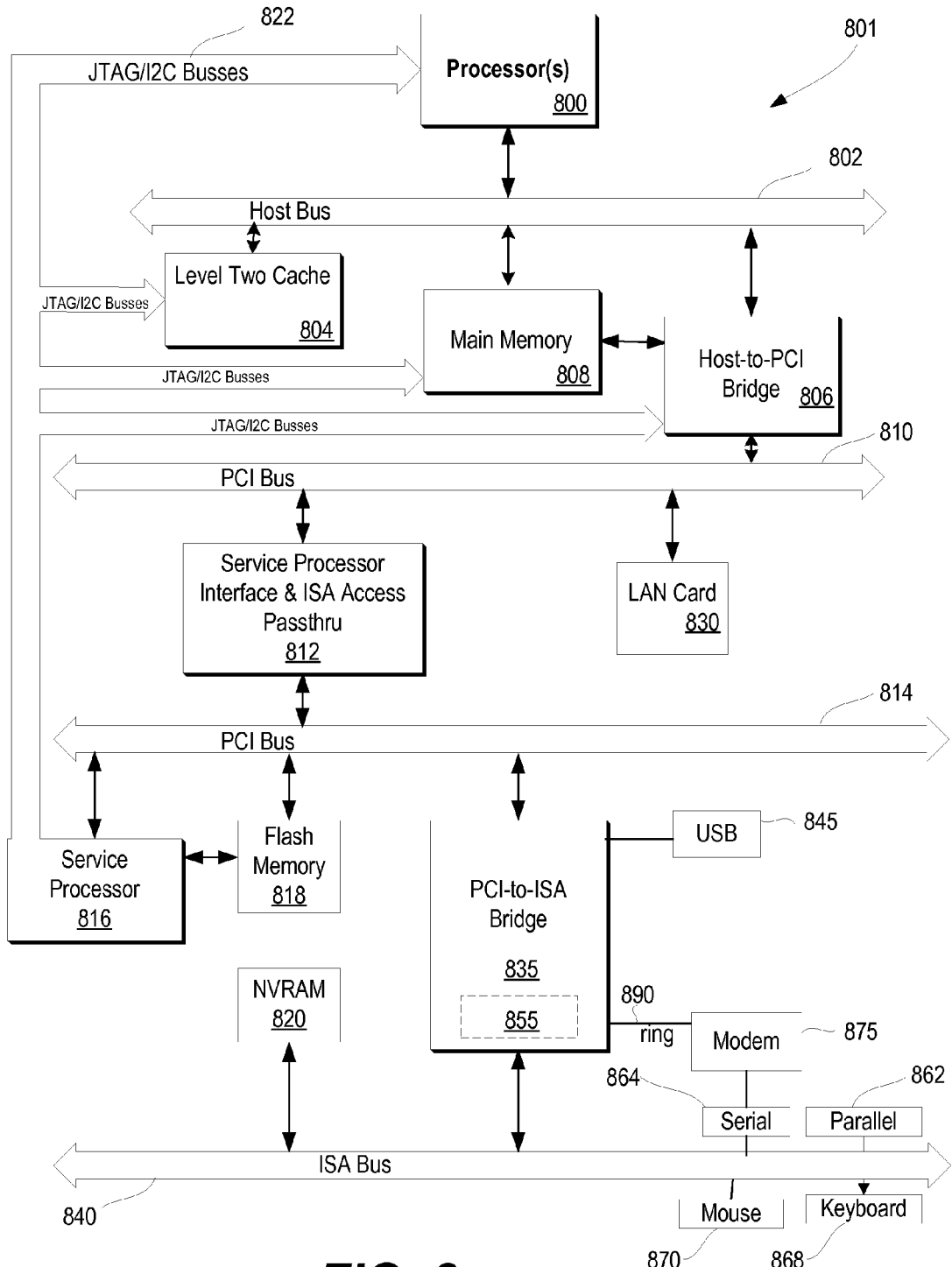
FIG. 8 is a block diagram of a computing device capable of implementing the present invention.

FIG. 8 illustrates information handling system 801 which is a simplified example of a computer system capable of performing the computing operations described herein. Computer system 801 includes processor 800 which is coupled to host bus 802. A level two (L2) cache memory 804 is also coupled to host bus 802. Host-to-PCI bridge 806 is coupled to main memory 808, includes cache memory and main memory control functions, and provides bus control to handle transfers among PCI bus 810, processor 800, L2 cache 804, main memory 808, and host bus 802. Main memory 808 is coupled to Host-to-PCI bridge 806 as well as host bus 802. Devices used solely by host processor(s) 800, such as LAN card 830, are coupled to PCI bus 810. Service Processor Interface and ISA Access Pass-through 812 provides an interface between PCI bus 810 and PCI bus 814. In this manner, PCI bus 814 is insulated from PCI bus 810. Devices, such as flash memory 818, are coupled to PCI bus 814. In one implementation, flash memory 818 includes BIOS code that incorporates the necessary processor executable code for a variety of low-level system functions and system boot functions.

PCI bus 814 provides an interface for a variety of devices that are shared by host processor(s) 800 and Service Processor 816 including, for example, flash memory 818. PCI-to-ISA bridge 835 provides bus control to handle transfers between PCI bus 814 and ISA bus 840, universal serial bus (USB) functionality 845, power management functionality 855, and can include other functional elements not shown, such as a real-time clock (RTC), DMA control, interrupt support, and system management bus support. Nonvolatile RAM 820 is attached to ISA Bus 840. Service Processor 816 includes JTAG and I2C busses 822 for communication with processor(s) 800 during initialization steps. JTAG/I2C busses 822 are also coupled to L2 cache 804, Host-to-PCI bridge 806, and main memory 808 providing a communications path between the processor, the Service Processor, the L2 cache, the Host-to-PCI bridge, and the main memory. Service Processor 816 also has access to system power resources for powering down information handling device 801.

Peripheral devices and input/output (I/O) devices can be attached to various interfaces (e.g., parallel interface 862, serial interface 864, keyboard interface 868, and mouse interface 870 coupled to ISA bus 840. Alternatively, many I/O devices can be accommodated by a super I/O controller (not shown) attached to ISA bus 840.

In order to attach computer system 801 to another computer system to copy files over a network, LAN card 830 is coupled to PCI bus 810. Similarly, to connect computer system 801 to an ISP to connect to the Internet using a telephone line connection, modem 865 is connected to serial port 864 and PCI-to-ISA Bridge 835.

While FIG. 8 shows one information handling system that employs processor(s) 800, the information handling system may take many forms. For example, information handling system 801 may take the form of a desktop, server, portable, laptop, notebook, or other form factor computer or data processing system. Information handling system 801 may also take other form factors such as a personal digital assistant (PDA), a gaming device, ATM machine, a portable telephone device, a communication device or other devices that include a processor and memory.

One of the preferred implementations of the invention is a client application, namely, a set of instructions (program code) in a code module that may, for example, be resident in the random access memory of the computer. Until required by the computer, the set of instructions may be stored in another computer memory, for example, in a hard disk drive, or in a removable memory such as an optical disk (for eventual use in a CD ROM) or floppy disk (for eventual use in a floppy disk drive), or downloaded via the Internet or other computer network. Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

While particular embodiments of the present invention have been shown and described, it will be obvious to those skilled in the art that, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. An apparatus comprising:
   an assembly substrate; and
   a whisker detector for detecting a tin whisker that forms between a sense gap, the sense gap including a planar gap and an orthogonal gap, the whisker detector comprising:
      a first sense trace and a second sense trace that are integrated onto the assembly substrate, the planar gap being the space between the first sense trace and the second sense trace, wherein the first sense trace and the second sense trace are coupled to the assembly substrate and reside on a single plane that is parallel to the assembly substrate; and
      a trace bridge coupled to the top of the first sense trace, the orthogonal gap being the space between the trace bridge and the second sense trace.

2. The apparatus of claim 1 wherein the planar gap is used to simultaneously detect the tin whisker in an X direction and a Y direction parallel to the assembly substrate, and wherein the orthogonal gap is used to detect the tin whisker in a Z direction relative to the assembly substrate.

3. The apparatus of claim 1 further comprising:
   one or more components that are assembled on the assembly substrate, wherein the tin whisker is detected after the components are assembled on the assembly substrate.

4. The apparatus of claim 3 further comprising:
   wherein one of the components is a processor; and wherein the processor receives a signal from the whisker detector in response to the formation of the tin whisker.

5. The apparatus of claim 3 wherein the whisker detector proceeds through same process steps as the assembly substrate when the one or more components are assembled onto the assembly substrate, the same process steps comprising preheating the assembly substrate and flowing solder on the assembly substrate.

6. The apparatus of claim 3 further comprising:
a plurality of whisker detectors that include the whisker detector, wherein each of the plurality of whisker detectors is associated with detecting another tin whisker that forms on one of a plurality of substrate sections that correspond to each of the whisker detectors.

7. The apparatus of claim 3 further comprising:
a plurality of traces associated with the plurality of components, a trace gap being the space between two adjacent traces included in the plurality of traces, wherein the sense gap is smaller than the trace gap.

8. The apparatus of claim 1 wherein the tin whisker is detected by performing a continuity test between the first sense trace and the second sense trace.

9. A computer-implemented method comprising:
detecting a tin whisker that forms between a sense gap using a whisker detector, the sense gap including a planar gap and an orthogonal gap, the whisker detector comprising:
a first sense trace and a second sense trace that are integrated onto an assembly substrate, the planar gap being the space between the first sense trace and the second sense trace, wherein the first sense trace and the second sense trace are coupled to the assembly substrate and reside on a single plane that is parallel to the assembly substrate; and
a trace bridge coupled to the top of the first sense trace, the orthogonal gap being the space between the trace bridge and the second sense trace;
generating a whisker detection interrupt in response to the detecting; and
notifying a user in response to the generation of the whisker detection interrupt.

10. The method of claim 9 wherein the planar gap is used for simultaneous tin whisker detection in an X direction and a Y direction parallel to the assembly substrate, and wherein the orthogonal gap is used for the tin whisker detection in a Z direction relative to the assembly substrate.

11. The method of claim 10 further comprising:
wherein the whisker detector proceeds through same process steps as the assembly substrate when one or more components are assembled onto the assembly substrate, the same process steps comprising preheating the assembly substrate and flowing solder on the assembly substrate.

12. The method of claim 11 wherein the generating is performed by one of a plurality of whisker detectors that are each associated with one of a plurality of substrate sections included on the assembly substrate, the whisker detector included in the plurality of whisker detectors.

13. The method of claim 10 wherein the planar gap and the orthogonal gap are smaller than a trace gap, the trace gap being the space between two adjacent traces included on the assembly substrate.

14. The method of claim 9 further comprising:
retrieving a log history that includes prior whisker detection interrupts;
determining, based upon the log history, that a prior whisker detection interrupt occurred; and
notifying the user in response to the determination.

15. A computer program product stored on a computer operable media, the computer operable media containing instructions for execution by a computer, which, when executed by the computer, cause the computer to implement a method for tin whisker detection, the method comprising:
detecting a tin whisker that forms between a sense gap using a whisker detector, the sense gap including a planar gap and an orthogonal gap, the whisker detector comprising:
a first sense trace and a second sense trace that are integrated onto an assembly substrate, the planar gap being the space between the first sense trace and the second sense trace, wherein the first sense trace and the second sense trace are coupled to the assembly substrate and reside on a single plane that is parallel to the assembly substrate; and
a trace bridge coupled to the top of the first sense trace, the orthogonal gap being the space between the trace bridge and the second sense trace;
generating a whisker detection interrupt in response the detecting; and
notifying a user in response to the generation of the whisker detection interrupt.

16. The computer program product of claim 15 wherein the planar gap is used for simultaneous tin whisker formation in an X direction and a Y direction parallel to the assembly substrate, and wherein the orthogonal gap is for the tin whisker formation in a Z direction relative to the assembly substrate.

17. The computer program product of claim 16 wherein the whisker detector proceeds through same process steps as the assembly substrate when one or more components are assembled onto the assembly substrate, the same process steps comprising preheating the assembly substrate and flowing solder on the assembly substrate.

18. The computer program product of claim 17 wherein the generating is performed by one of a plurality of whisker detectors that are each associated with one of a plurality of substrate sections included on the assembly substrate, the whisker detector included in the plurality of whisker detectors.

19. The computer program product of claim 16 wherein the planar gap and the orthogonal gap are smaller than a trace gap, the trace gap being the space between two adjacent traces included on the assembly substrate.

20. The computer program product of claim 15 wherein the method further comprises:
retrieving a log history that includes prior whisker detection interrupts;
determining, based upon the log history, that a prior whisker detection interrupt occurred; and
notifying the user in response to the determination.

* * * * *